US011465511B2

(12) United States Patent
Proietty et al.

(10) Patent No.: US 11,465,511 B2
(45) Date of Patent: Oct. 11, 2022

(54) SYSTEMS AND METHODS TO DETERMINE AND VALIDATE TORQUE OF AN ELECTRIC MACHINE

(71) Applicant: FORD GLOBAL TECHNOLOGIES, LLC, Dearborn, MI (US)

(72) Inventors: John Proietty, Ferndale, MI (US); Susan Rebecca Cikanek, Northville, MI (US); Bader M. Badreddine, Dearborn Heights, MI (US); William Reynolds, Tecumseh (CA); Matthew Allan Herrmann, Royal Oak, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 297 days.

(21) Appl. No.: 16/742,276

(22) Filed: Jan. 14, 2020

(65) Prior Publication Data

US 2021/0213837 A1 Jul. 15, 2021

(51) Int. Cl.
*B60L 15/02* (2006.01)
*B60W 10/08* (2006.01)
*H02P 6/08* (2016.01)
*H02P 6/16* (2016.01)
*H02P 21/22* (2016.01)
(Continued)

(52) U.S. Cl.
CPC ........... *B60L 15/025* (2013.01); *B60W 10/08* (2013.01); *H02P 6/08* (2013.01); *H02P 6/16* (2013.01); *H02P 21/20* (2016.02); *H02P 21/22* (2016.02); *H03M 1/485* (2013.01); *B60L 2240/423* (2013.01); *B60W 2510/083* (2013.01); *B60W 2710/083* (2013.01)

(58) Field of Classification Search
CPC . B60L 15/025; B60L 2240/423; B60W 10/08; B60W 2510/083; B60W 2710/083; H02P 6/08; H02P 6/16; H02P 21/20; H02P 21/22; H03M 1/485
See application file for complete search history.

(56) References Cited

U.S. PATENT DOCUMENTS 4,961,038 A * 10/1990 MacMinn ............. H02P 25/098
318/696
5,694,265 A * 12/1997 Kosugi .................. G11B 5/596
(Continued)

*Primary Examiner* — Eduardo Colon Santana
*Assistant Examiner* — Devon A Joseph
(74) *Attorney, Agent, or Firm* — David B Kelley; Brooks Kushman P.C.

(57) ABSTRACT

A vehicle includes a multi-core processor having first, second, and cores and having first and second analog-to-digital converters (ADC) associated with the first and second cores, respectively. The first and second ADC are configured to convert analog phase currents to first and second digital phase current values, respectively. The multi-core processor is configured to generate first and second rotor-angle data from digital signals representing a position of the electric machine. The processor is programmed to, via the first core, estimate a first output torque of the electric machine based on the first rotor-angle data and the first digital phase current values, via the second core, estimate a second output torque based on the second rotor-angle data and the second digital phase current values, and, via the third core, command de-activation of the electric machine in response to a difference between the first and second output torques exceeding a threshold.

19 Claims, 3 Drawing Sheets

(51) Int. Cl.
*H03M 1/48* (2006.01)
*H02P 21/20* (2016.01)

(56) References Cited

U.S. PATENT DOCUMENTS

| | | |
|---|---|---|
| 6,904,813 B2 | 6/2005 | Zaremba et al. |
| 8,904,813 B2 | 12/2014 | Lifson et al. |
| 2005/0050965 A1* | 3/2005 | Zaremba ............... B60L 15/025 |
| | | 73/862.08 |
| 2014/0232311 A1* | 8/2014 | Hill ..................... H02P 6/185 |
| | | 318/400.33 |
| 2019/0238076 A1* | 8/2019 | Yamazaki ................ H02P 8/34 |

* cited by examiner

SYSTEMS AND METHODS TO DETERMINE AND VALIDATE TORQUE OF AN ELECTRIC MACHINE

TECHNICAL FIELD

This disclosure relates to electrified vehicles and more specifically to determining and validating torque of an electric machine.

BACKGROUND

Vehicles may include electric powertrains to improve fuel economy and reduce emissions. Electric powertrains utilize a traction motor to power driven wheels of the vehicle. The traction motor is powered by a traction battery, fuel cell, or other electrical power source. The traction motor may be used in conjunction with an internal-combustion engine in a hybrid vehicle or as the sole power source in an electric vehicle.

SUMMARY

According to one embodiment, a vehicle includes an electric machine and a multi-core processor having first, second, and third cores. The first and second cores having first and second analog-to-digital converters (ADC) associated with the first and second cores, respectively. The first and second ADC are configured to convert analog phase currents of the electric machine to first and second digital phase current values, respectively. The multi-core processor is configured to independently generate first and second rotor-angle data from digital signals representing a position of the electric machine. The multi-core processor is programmed to, via the first core, via the first core, estimate a first output torque of the electric machine based on the first rotor-angle data and the first digital phase current values, via the second core, estimate a second output torque of the electric machine based on the second rotor-angle data and the second digital phase current values, and, via the third core, command de-activation of the electric machine in response to a difference between the first and second output torques exceeding a threshold.

According to another embodiment, a method of validating output torque of an electric machine with a multi-core processor having first and second cores and first and second analog-to-digital converters (ADC) associated with the first and second cores, respectively. The method includes: converting analog phase currents of the electric machine to first and second digital phase current values via the first and second ADC; independently generating first and second rotor-angle data from digital signals representing a position of the electric machine; via the first core, estimating a first output torque of the electric machine based on the first rotor-angle data and the first digital phase current values; via the second core, estimating a second output torque of the electric machine based on the second rotor-angle data and the second digital phase current values; sending a fault signal from the second core to the third core in response to a difference between the first and second output torques exceeding a threshold; and via the third core, commanding de-activation of the electric machine in response to receiving the fault signal.

According to yet another embodiment, a vehicle includes an electric machine and a multi-core processor having first, second, and third cores. The first and second cores have first and second analog-to-digital converters (ADC) associated with the first and second cores, respectively. The first and second ADC being configured to convert analog phase currents of the electric machine to first and second digital phase current values, respectively, wherein the multi-core processor is configured to independently generate first and second rotor-angle data from digital signals representing a position of the electric machine. The multi-core processor is programmed to, via the first core, estimate a first output torque of the electric machine based on the first rotor-angle data and the first digital phase current values, via the second core, estimate a second output torque of the electric machine based on the second rotor-angle data and the second digital phase current values, via the second core, comparing the first output torque to the second output torque to determine a difference, and, via the third core, commanding de-activation of the electric machine in response to the difference exceeding a threshold.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
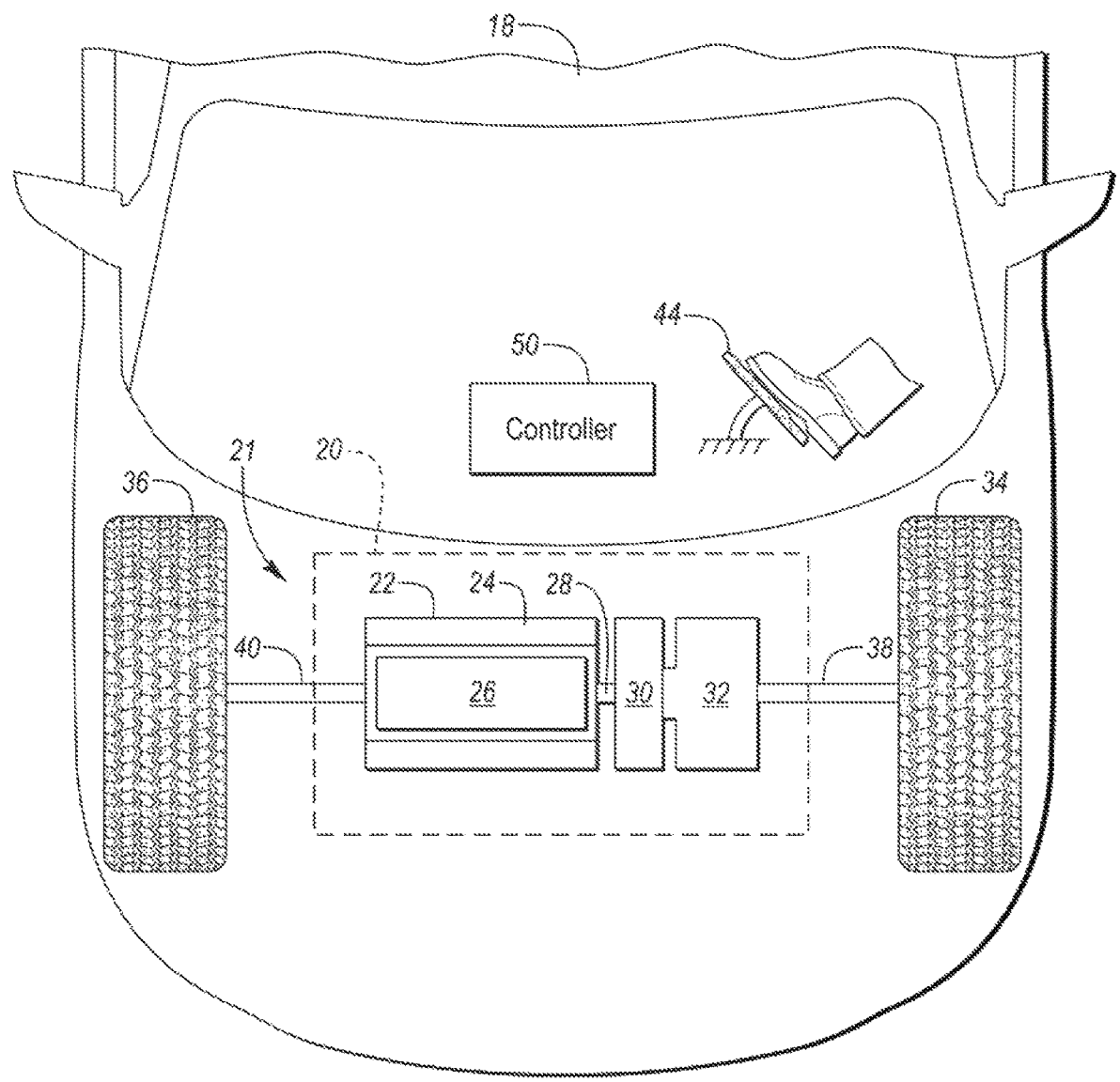
FIG. 1 is a schematic diagram of a vehicle having at least one electric drive axle.

Referring to FIG. 1, an electrified vehicle 18 includes at least one electric powertrain 20. The electric powertrain 20 may be used to power driven wheels of an electrified vehicle, such as a passenger car, truck, sport-utility vehicle, or crossover. In the illustrated embodiment, the electric powertrain 20 is packaged as an electric drive axle (eAxle) that may be used as a front and/or rear drive axle of the electrified vehicle. While not shown, the vehicle 18 may also include a traditional powertrain, e.g., internal-combustion engine, transmission, etc., when embodied as a hybrid vehicle. The vehicle 18 may also include a second electric powertrain for powering the other axle of the vehicle, e.g., a four-wheel drive electric vehicle.

According to an example embodiment, the powertrain 20 includes an electric machine 22, typically called a traction motor, that produces drive torque. The traction motor 22 may also act as a generator, such as during regenerative braking. The motor 22 may be a three-phase alternating current (AC) machine. The traction motor 22 may be powered by a traction battery (not shown). The traction motor 22 includes a stator 24 and a rotor 26 supported for rotation within the stator 24. An output shaft 28 of the traction motor 22 is rotationally fixed to the rotor 26. An end portion of the output shaft 28 is coupled to a speed reducer 30 (also known as a transmission or gearbox) configured to reduce speed of the output shaft 28 creating torque multiplication. The speed reducer 30 may have a single, fixed speed ratio (sometimes referred to as a one-speed) or may include multiple speeds such as a two-speed gearbox. An output member of the speed reducer 30 is coupled to a differential 32 configured to distribute the motor power between the first wheel 34 and the second wheel 36. The differential 32 is also configured to permit speed differences between the first and second wheels 34, 36 to facilitate cornering of the vehicle. The differential and the transmission may be integrated in single assembly. A first half shaft 38 connects the differential 32 to the first wheel 34, and a second half shaft 40 connects the differential 32 to the second wheel 36. Used herein "half shaft" refers to any shaft that transmits power from a differential to a driven wheel.

The vehicle 18 includes one or more controllers such as a powertrain control unit (PCU), a motor control unit (MCU), and a high-voltage battery controller, sometimes called a Battery Electric Control Module (BECM). While illustrated as one controller, the controller 50 may be part of a larger control system and may be controlled by various other controllers throughout the vehicle 18, such as a vehicle system controller (VSC). It should therefore be understood that the controller 50 and one or more other controllers can collectively be referred to as a "controller" that controls various actuators in response to signals/data from various sensors to control functions. Controller 50 may include a microprocessor or central processing unit (CPU) in communication with various types of computer-readable storage devices or media. The microprocessor may include multiple cores, such as a dual-core processor. Computer-readable storage devices or media may include volatile and nonvolatile storage in read-only memory (ROM), random-access memory (RAM), and keep-alive memory (KAM), for example. KAM is a persistent or non-volatile memory that may be used to store various operating variables while the CPU is powered down. Computer-readable storage devices or media may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the controller in controlling the vehicle.

The controller 50 communicates with various vehicle sensors and actuators via an input/output (I/O) interface that may be implemented as a single integrated interface that provides various raw data or signal conditioning, processing, and/or conversion, short-circuit protection, and the like. Alternatively, one or more dedicated hardware or firmware chips may be used to condition and process particular signals before being supplied to the CPU. Although not explicitly illustrated, those of ordinary skill in the art will recognize various functions or components that may be controlled by controller 50 within each of the subsystems identified above.

An accelerator pedal 44 is used by the driver of the vehicle to provide a demanded torque, power, or drive command to propel the vehicle. This is commonly referred to as driver-demanded torque. The pedal 44 may include a pedal-position sensor. In general, depressing and releasing the pedal 44 causes the pedal sensor to generate accelerator-pedal-position data that may be interpreted by the controller 50 as a demand for increased power or decreased power, respectively. Based at least upon input from the pedal, the controller 50 commands torque from the vehicle actuators, e.g., motor 22. The driver-demanded torque may be determined by a lookup table that correlates accelerator-pedal position and possible other vehicle conditions such as impeller speed (if provided). Once the driver-demanded torque is determined, the controls determines the torque split between various actuators (arbitration) and takes appropriate action to produce the desired torque from the actuators. In the case of a single actuator, e.g., a vehicle 18 with only one powertrain 21, all of the driver-demanded torque is commanded to the motor 22.

Proper operation of the vehicle 18 requires that the motor 22 actually produces (within an acceptable range) the commanded torque. If the motor 22 produces substantially more torque than commanded, the vehicle will accelerate more than the driver is requesting. Similarly, if the motor 22 produces substantially less torque than commanded, the vehicle will be sluggish relative to driver expectations. To ensure proper operation, the vehicle 18 monitors and validates the torque produced by the motor 22 to ensure that it closely mirrors the commanded torque. Closed-loop feedback controls may be used to reduce the error (difference) between the produced torque and the commanded torque.

Figure 2:
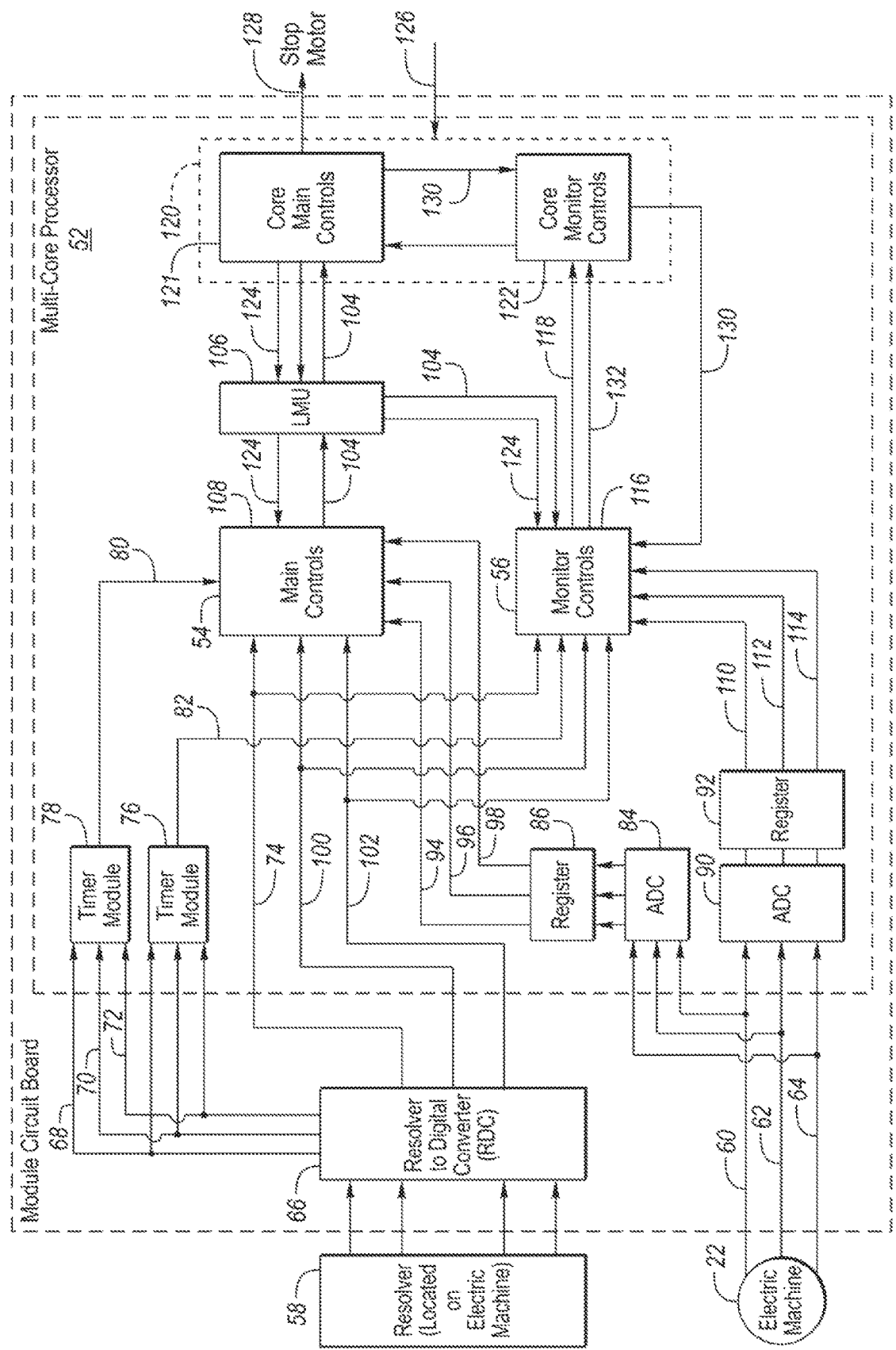
FIG. 2 is schematic diagram of controls for operating an electric machine.

Referring to FIG. 2, the controller 50 may be a multi-core processor 52 having a first core 54 and a second core 56. The controller 50 may be programmed with main controls and monitor controls for the motor 22. Generally, the main controls are performed by the first core, and the second core performs the monitor controls as well as some main controls. Both the main controls and the monitor controls estimate the produced torque of the motor 22, which may be referred to as the estimated output motor torque. Generally, the main controls are responsible for operating the motor 22 based on inputs such as a motor torque command, which is based on driver-demanded torque, whereas the monitor controls provide a check to ensure that the main controls are accurately estimating parameters such as the produced motor torque and motor current. The main controls and the monitor controls may have at least some independent hardware and software (as shown in FIG. 2) to be robust to system faults. For example, motor and/or generator controls are performed in the first core 54 due to a higher task rate for the calculations required for motor and generator torque control. Monitor controls may be performed in the second core 56, which may have a slower task rate. The monitor controls in the core 56 will validate the core 54 torque calculations among other things. This can done at a slower task rate due to not directly interacting with either actuator.

The electric machine 22 includes a resolver 58 that is located within the housing of the electric machine. The resolver 58 senses rotation of the rotor 26 and is used to determine rotor speed and position. The motor 22 also includes current sensors 60, 62, 64, one associated with each of the phases of the motor 22.

The resolver 58 outputs high and low sine signals and high and low cosine signals to a resolver-to-digital converter (RDC) 66 that converts the sine and cosine signals to digital pulses 68, 70, 72 readable by the multicore processor 52. The RDC may be included as part of the integrated circuitry and has the capability to determine resolver error states based on the resolver sine and cosine signal failures. Additionally, the RDC 66 may perform diagnostic checks such as a range check on the sine and cosine signals from the resolver 58 as well as open circuit check for each resolver input. If the diagnostics determine a problem, error data 74 is generated. Both the main and monitor controls may directly read the resolver diagnostics. The resolver error 74 may indicate any resolver signal abnormality or RDC integrated circuit abnormality.

The multicore processor 52 includes multiple registers (timer modules) that convert the digital pulses 68, 70, 72 into a resolver angle. For example, a pair of timer modules, timer module 76 and timer module 78, may be used. Any type of processor timer module may be used depending upon the structure of the multicore processor. Timer module 78 may be used for the main controls, and timer module 76 may be used for the monitor controls. The timer module 78 receives the pulse signals 68, 70, 72 and outputs rotor-angle data 80. The timer module 76 receives the pulse signals 68, 70, 72 and outputs rotor-angle data 82.

The main and monitor controls each include their own analog-to-digital converter (ADC) and register for the current signals 60, 62, 64. Associated with the main controls is ADC 84 and register 86. The ADC 84 receives signals from the current sensors 60, 62, 64 and outputs current data to the register 86. Associated with the main controls is ADC 90 and register 92. The register 86 holds the current data for output to the core 54. The ADC 90 receives signals from the current sensors 60, 62, 64 and outputs current data to the register 92. The register 92 holds the motor current data for output to the core 56.

The main controls, at box 108, receives the rotor-angle data 80, the resolver-error data 74, the current data 94, 96, 98, and sine and cosine data 100, 102. Using this data, the main controls, which run on the core 54, calculate the estimated output motor torque 104, which is the torque produced at the rotor shaft. The output motor torque 104 is based on the rotor angle and the motor currents. Field oriented control of the three-phase machine may be used. The main controls may write values of each output motor torque to separate protected memorably locations within a local-memory unit (LMU) 106. The LMU 106 is used to pass variables between the first core 54 and the second core 56 of the multicore processor 52, i.e., the LMU a gateway.

The monitor controls, at box 116, receives the rotor angle 82, the resolver error 74, the current 110, 112, 114, and sine and cosine data 100, 102. Using this data, the monitor controls, which run on the core 56, calculate the output motor torque 118. The output motor torque 118 is based on the rotor angle and the motor currents as discussed above.

The multi-core processor 52 may also include a third core 120 that includes main controls 121 and monitor controls 122. The LMU is also a gateway between the memories of the cores 54, 56 and core 120. Box 120 may receive the driver-demanded torque based on pedal-position data 126 from the pedal 44. Controls within box 121 may determine the component of the driver-demanded torque to be commanded to the motor 22 (commanded motor torque 124). The commanded motor torque 124 is sent to both the first and second cores 54, 56 via the LMU 106. Box 120 also receives the output torque 104 from the LMU 106. The monitor controls at box 122 also may receive the driver-demanded torque command. The monitor controls at box 122 may determine if the torque delivered to the wheels exceeds the driver-demanded torque by a predetermined (calibratable) excessive amount. The monitor controls at box 122 may determine if the torque commanded to the motor 124, or to each actuator on the vehicle, exceeds another predetermined excessive amount.

The output torque 104 and the commanded motor torque 124 are passed to box 116. Controls within box 116 compare the torques to each other to determine if the output torques 104, 118 substantially match and to determine if the motor 22 is actually producing the commanded torque 124. This will be described in more detail below.

Control logic or functions performed by controller 50 may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but is provided for ease of illustration and description. The control logic may be implemented primarily in software executed by a microprocessor-based vehicle, engine, and/or powertrain controller, such as controller 50. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

Figure 3:
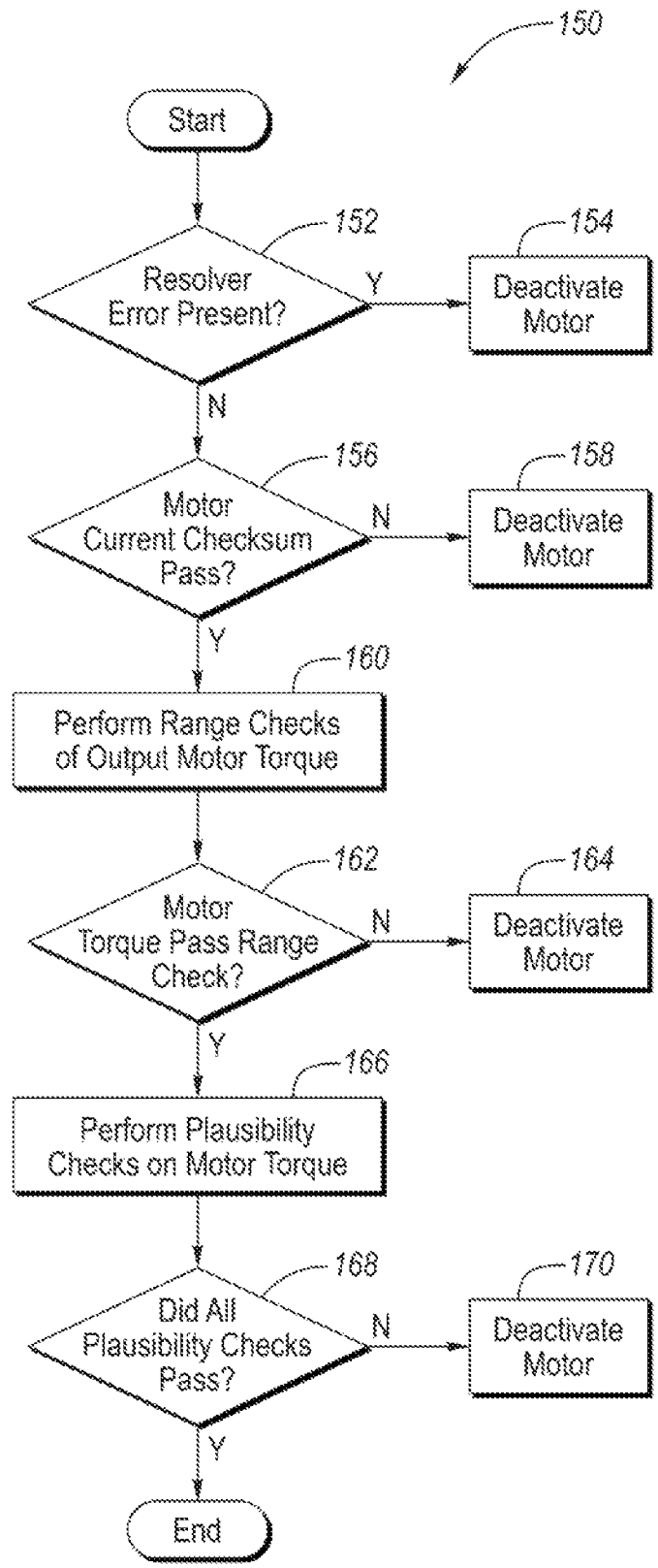
FIG. 3 is a flow chart of an algorithm for validating output torque of the electric machine.

FIG. 3 is a flowchart 150 of an algorithm for determining motor torque, validating motor torque, and controlling the motor if a fault is detected. For ease of description the flowchart 150 will be discussed with reference to the embodiment of FIG. 2 but is not limited thereto. Controls began at operation 152 where the controller determines if a resolver error, e.g., error 74, is present. If yes, the motor is de-activated at operation 154. The motor may be deactivated by either the main controls of core 54 or the monitor controls of core 56 as both controls receive the resolver error 74. Used herein, deactivation of the motor does not necessarily mean that the motor is fully deactivated, i.e., produces no torque, and may also refer to a safety mode (limp-home mode) in which the motor is operated in at reduced torque. In some embodiments, deactivation may be full deactivation of the motor.

If no at operation 150, control passes to operation 156 and a checksum is performed for the current sensors. The sum of the current readings from the three current sensors should be either zero or 360. If the summation of currents does not equal (or is not within a threshold of) zero or 360 an error is present. The checksum is performed by both the main controls and the monitor controls. This provides robustness to the system as each of the main and monitor controls has its own ADC and register. If the checksum fails in either of the main controls or the monitor controls, control passes to operation 158 and the motor is deactivated. The third core 120 may be programmed to command a deactivation command 128.

At operation 160, the estimated output motor torque for both the main controls and the monitor controls, e.g. torque 104 and torque 118, are compared to the rated range of torques for the motor. Electric motors have a rated range of output torques. If an estimated torque is outside of this range, the estimated torque is likely inaccurate. If the controller determines that any of the estimated torques fail the range check at operation 162, control passes to operation 164 and the motor is deactivated by the third core for example.

If yes at operation 162, control passes operation 166 and plausibility checks on the produced motor torque are performed. The controls 150 may perform four plausibility checks. The plausibility test may be performed in box 116 of the monitor controls of core 56. The plausibility tests may use absolute values of the compared parameters. The first test compares the output torque 104 to the output torque 118. For example, the output torque 104 may be subtracted from the output torque 118 to determine a difference. If the difference exceeds a first threshold, the test fails and an error is generated.

The second test compares the commanded torque of the main controls, e.g., commanded torque 124, with the output torque 104 of the main controls. For example, the output torque 104 may be subtracted from the commanded torque 124 to determine a difference. If the difference exceeds a second threshold, the test fails and an error is generated.

The third test compares the commanded torque 124, with the output torque 118 of the monitor controls. For example, the output torque 118 may be subtracted from the commanded torque 124 to determine a difference. If the difference exceeds a third threshold, the test fails and an error is generated.

The fourth test compares the commanded motor torque 124 calculated by the main controls 121 with the commanded motor torque 130 of the monitor controls 122. If a difference between these torques exceeds a fourth threshold, the test fails and an error is generated.

Control passes to operation 168 after the four plausibility checks have been performed. If any of the tests fails, a fault signal 132 is sent from the core 56 to the monitor controls 122 of core 120. At operation 170 the motor is deactivated by the third core by issuing a deactivation command 128. If all of the test pass, no action is taken, i.e., normal operation continues, and control loops back to the start.

While shown and described for a single motor, the controls can also be used for multiple motors. The multi-core processor 52 may be used to control the second electric machine with some additional hardware and software. The second motor includes its own resolver and current sensors. An additional RDC associated with the second motor added to the module. The multi-core processor will further include two additional timer modules associated with the additional RDC. The multi-core processor will also further include two ADCs and two registers associated with the second motor. The cores 54 and 56 will further include main and monitor controls for the second motor that are separate from the controls for the first motor 22. The main and monitor controls for the second motor may operate as described above.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A vehicle comprising:
an electric machine;
a multi-core processor having first, second, and third cores, the first and second cores having first and second analog-to-digital converters (ADC) associated with the first and second cores, respectively, the first and second ADC being configured to convert analog phase currents of the electric machine to first and second digital phase current values, respectively, wherein the multi-core processor is configured to independently generate first and second rotor-angle data from digital signals representing a position of the electric machine, and wherein the multi-core processor is programmed to:
via the first core, estimate a first output torque of the electric machine based on the first rotor-angle data and the first digital phase current values,
via the second core, estimate a second output torque of the electric machine based on the second rotor-angle data and the second digital phase current values,
via the third core, command de-activation of the electric machine in response to a difference between the first and second output torques exceeding a threshold,
via the third core, generate a commanded torque for the electric machine based on a driver-demanded torque, and
via the third core, command de-activation of the electric machine in response to a second difference between the first output torque and the commanded torque exceeding a second threshold.

2. The vehicle of claim 1, wherein the processor further includes a local-memory unit interfacing between the first and second cores and the third core.

3. The vehicle of claim 1, wherein the multi-core processor is further programmed to:
via the third core, command de-activation of the electric machine in response to a third difference between the second output torque and the commanded torque exceeding a third threshold.

4. The vehicle of claim 3, wherein the multi-core processor is further programmed to:
via the third core, generate a second commanded torque for the electric machine based on the driver-demanded torque, and
via the third core, command de-activation of the electric machine in response to a fourth difference between the commanded torque and the second commanded torque exceeding a fourth threshold.

5. The vehicle of claim 1, wherein each of the ADC includes an associated register.

6. The vehicle of claim 1, wherein the multi-core processor further implements first and second timer modules associated with the first and second cores, respectively, and wherein the first and second rotor-angle data are generated via the first and second timer modules, respectively.

7. The vehicle of claim 1, wherein the multi-core processor further includes a local-memory unit configured to receive the second output torque from the second core and output the second output torque to the first core.

8. The vehicle of claim 1 further comprising:
a resolver configured to sense position of the electric machine and output analog signals representing a position of the electric machine; and
a resolver analog-to-digital converter that coverts the analog signals to the digital signals.

9. The vehicle of claim 8, wherein the multi-core processor is further programmed to, in response to the first core receiving error data from the resolver analog-to-digital converter, command de-activation of the electric machine via the third core.

10. The vehicle of claim 1, wherein the multi-core processor further implements first and second timer modules associated with the first and second cores, respectively, and wherein the first and second rotor-angle data are generated via the first and second timer modules, respectively.

11. A method of validating output torque of an electric machine with a multi-core processor having first, second, and third cores and first and second analog-to-digital converters (ADC) associated with the first and second cores, respectively, the method comprising:
converting analog phase currents of the electric machine to first and second digital phase current values via the first and second ADC;
independently generating first and second rotor-angle data from digital signals representing a position of the electric machine;
via the first core, estimating a first output torque of the electric machine based on the first rotor-angle data and the first digital phase current values;
via the second core, estimating a second output torque of the electric machine based on the second rotor-angle data and the second digital phase current values;
sending a fault signal from the second core to the third core in response to a difference between the first and second output torques exceeding a threshold; and
via the third core, commanding de-activation of the electric machine in response to receiving the fault signal.

12. The method of claim 11 further comprising:
via the third core, generating a commanded torque for the electric machine based on a driver-demanded torque; and
via the third core, commanding de-activation of the electric machine in response to a second difference between the first output torque and the commanded torque exceeding a second threshold.

13. The method of claim 12 further comprising, via the third core, commanding de-activation of the electric machine in response to a third difference between the second output torque and the commanded torque exceeding a third threshold.

14. The method of claim 11 further comprising, via the third core, commanding de-activation of the electric machine via the second core in response to the first core receiving resolver-error data.

15. The method of claim 11 further comprising:
via the third core, generating a commanded torque for the electric machine based on a driver-demanded torque;
via the second core, comparing the commanded torque to the second output torque to determine a second difference; and
via the third core, commanding de-activation of the electric machine in response to the second difference exceeding a second threshold.

16. A vehicle comprising:
an electric machine;
a multi-core processor having first, second, and third cores, the first and second cores having first and second analog-to-digital converters (ADC) associated with the first and second cores, respectively, the first and second ADC being configured to convert analog phase currents of the electric machine to first and second digital phase current values, respectively, wherein the multi-core processor is configured to independently generate first and second rotor-angle data from digital signals representing a position of the electric machine, and wherein the multi-core processor is programmed to:
via the first core, estimate a first output torque of the electric machine based on the first rotor-angle data and the first digital phase current values,
via the second core, estimate a second output torque of the electric machine based on the second rotor-angle data and the second digital phase current values,
via the second core, comparing the first output torque to the second output torque to determine a difference, and
via the third core, commanding de-activation of the electric machine in response to the difference exceeding a threshold.

17. The vehicle of claim 16, wherein the processor further includes a local-memory unit interfacing between the first and second cores and the third core.

18. The vehicle of claim 16, wherein the multi-core processor is further programmed to:
via the third core, generate a commanded torque for the electric machine based on a driver-demanded torque, and
via the third core, command de-activation of the electric machine in response to a second difference between the first output torque and the commanded torque exceeding a second threshold.

19. The vehicle of claim 18, wherein the multi-core processor is further programmed to:
via the third core, command de-activation of the electric machine in response to a third difference between the second output torque and the commanded torque exceeding a third threshold.

* * * * *